United States Patent
Sato et al.

(10) Patent No.: US 10,720,313 B2
(45) Date of Patent: Jul. 21, 2020

(54) MEASURING DEVICE, MEASUREMENT METHOD, AND PLASMA PROCESSING DEVICE

(71) Applicant: Tokyo Electron Limited, Tokyo (JP)

(72) Inventors: Masanori Sato, Miyagi (JP); Ryusei Kashimura, Miyagi (JP); Tetsu Tsunamoto, Miyagi (JP); Yoshinori Osaki, Miyagi (JP); Toshiyuki Arakane, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/108,726

(22) Filed: Aug. 22, 2018

(65) Prior Publication Data

US 2019/0066982 A1 Feb. 28, 2019

(30) Foreign Application Priority Data

Aug. 23, 2017 (JP) ................................ 2017-160547
Jul. 6, 2018 (JP) ................................ 2018-129302

(51) Int. Cl.
*G01R 31/00* (2006.01)
*H01J 37/32* (2006.01)
*H01L 21/683* (2006.01)
*H01L 21/67* (2006.01)

(52) U.S. Cl.
CPC .. *H01J 37/32577* (2013.01); *H01J 37/32522* (2013.01); *H01J 37/32697* (2013.01); *H01J 37/32724* (2013.01); *H01J 37/32862* (2013.01); *H01J 37/32926* (2013.01); *H01J 37/32981* (2013.01); *H01L 21/67253* (2013.01); *H01L 21/6833* (2013.01); *H01J 2237/334* (2013.01)

(58) Field of Classification Search
USPC ............................................ 324/703, 754.24
See application file for complete search history.

(56) References Cited

U.S. PATENT DOCUMENTS

| 5,868,848 | A | 2/1999 | Tsukamoto |
| 2014/0083977 | A1* | 3/2014 | Ui et al. |
| 2014/0375299 | A1* | 12/2014 | Belostotskiy et al. |
| 2015/0303092 | A1* | 10/2015 | Kawbata |

FOREIGN PATENT DOCUMENTS

| JP | 2001-148374 | 5/2001 |
| JP | 2006-093342 | 4/2006 |

* cited by examiner

*Primary Examiner* — Vincent Q Nguyen
(74) *Attorney, Agent, or Firm* — IPUSA, PLLC

(57) ABSTRACT

A measuring device includes a switch that switches a connection of an electrode to which a direct current voltage is applied, wherein the electrode is within an electrostatic chuck disposed in a plasma processing device; a component provided with electrostatic capacitance, wherein the component is connected to the switch; and a measuring unit that measures a value corresponding to an electric charge amount accumulated in the component provided with the electrostatic capacitance.

7 Claims, 10 Drawing Sheets

FIG.1A

A GROUNDING ELECTRODE
K HIGH FREQUENCY ELECTRODE
$C_B$: BLOCKING CAPACITOR

FIG.1B

A GROUNDING ELECTRODE
K HIGH FREQUENCY ELECTRODE
$C_B$: BLOCKING CAPACITOR

MEASURING DEVICE, MEASUREMENT METHOD, AND PLASMA PROCESSING DEVICE

CROSS-REFERENCE TO RELATED APPLICATION

The present application is based upon and claims the benefit of priority of Japanese Patent Application No. 2017-160547, filed on Aug. 23, 2017, and Japanese Patent Application No. 2018-129302, filed on Jul. 6, 2018, the entire contents of which are incorporated herein by reference.

BACKGROUND OF THE INVENTION

1. Field of the Invention

The present invention relates to a measuring device, a measurement method, and a plasma processing device.

2. Description of the Related Art

During plasma processing executed within a plasma processing device, such as etching or film formation, it is important to detect a state of a plasma so as to control an etching rate or a film formation rate. In order to detect (measure) a state of plasma, a method of measuring a self bias voltage Vdc has been proposed (e.g., Patent Document 1 (Japanese Unexamined Patent Publication No. 2001-148374) and Patent Document 2 (Japanese Unexamined Patent Publication No. 2006-93342)).

According to Patent Document 1, the self bias voltage Vdc is indirectly measured by a device that does not directly contact plasma. In Patent Document 1, the device is provided within a processing container wall. In the device, a voltage applied to electrodes isolated by a dielectric material is measured, and the self bias voltage Vdc is calculated from the measured voltage while considering stray capacitance.

According to Patent Document 2, a measuring circuit for measuring the self bias voltage Vdc is embedded in a matching circuit, and a value of input resistance of the measuring circuit is adjusted to be sufficiently greater than a resistance value of a shower head. Then, the self bias voltage Vdc is measured by the measuring circuit.

SUMMARY OF THE INVENTION

In the above-described methods, a design change of the device or the circuit may be required, and it is not easy to measure the self bias voltage Vdc. For example, in Patent Document 1, in order to provide a device within the processing container wall, mechanical processing is applied to the processing container wall. Moreover, a measurement probe is provided at a position separated from the plasma to be measured. Accordingly, sensitivity and accuracy of the measurement are lowered. In Patent Document 2, it is required to embed the measuring circuit for measuring the self bias voltage Vdc in the matching circuit, and, thus, a design change of the plasma processing device is required.

As described above, according to Patent Documents 1 and 2, a change in mechanical design of the plasma processing device and a modification of a high frequency circuit (the matching circuit) are required for embedding the probe and the measuring circuit for measuring the self bias voltage Vdc. Accordingly, the methods described in Patent Documents 1 and 2 may lack versatility and simplicity of measurement.

There is a need for a method with which the self bias voltage Vdc of plasma can be easily measured.

According to an aspect of the present invention, there is provided a measuring device including a switch that switches a connection of an electrode to which a direct current voltage is applied, wherein the electrode is within an electrostatic chuck disposed in a plasma processing device; a component provided with electrostatic capacitance, wherein the component is connected to the switch; and a measuring unit that measures a value corresponding to an electric charge amount accumulated in the component provided with the electrostatic capacitance.

According to another aspect of the present invention, there is provided a measurement method including: switching a connection of an electrode, wherein the electrode is within an electrostatic chuck disposed in a plasma processing device; applying high frequency electric power to the electrostatic chuck; and measuring a value corresponding to an electric charge amount accumulated in a component provided with electrostatic capacitance, wherein the component provided with the electrostatic capacitance is connected to the electrode by the switching.

According to another aspect of the present invention, there is provided a plasma processing device including a high frequency power source that applies high frequency electric power; a switch that switches a connection of an electrode to which a direct current voltage is applied, wherein the electrode is within an electrostatic chuck disposed in a plasma processing device; a component provided with electrostatic capacitance, wherein the component is connected to the switch; and a measuring unit that measures a value corresponding to an electric charge amount accumulated in the component provided with the electrostatic capacitance.

According to an embodiment of the present invention, the self bias voltage Vdc can be easily measured.

Other objects, features and advantages of the present invention will become more apparent from the following detailed description when read in conjunction with the accompanying drawings.

DESCRIPTION OF THE PREFERRED EMBODIMENTS

In the following, an embodiment of the present invention is described by referring to the drawings. Note that, in the specification and the drawings, duplicate descriptions are omitted by attaching identical reference numerals to substantially the same configurations.

[Self Bias Voltage]

Figure 1A:
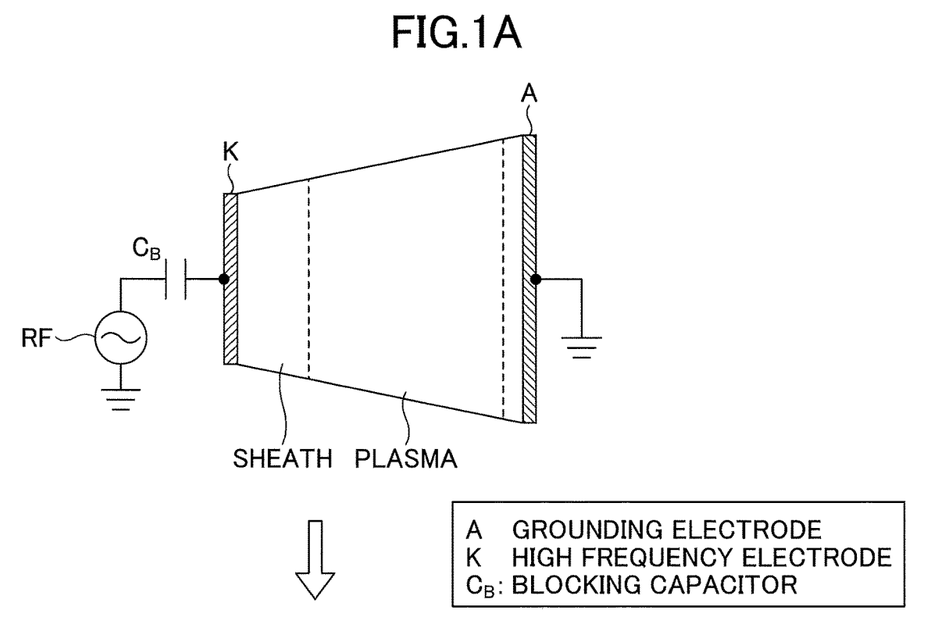
FIGS. 1A and 1B are diagrams illustrating a self bias voltage.
Figure 1B:
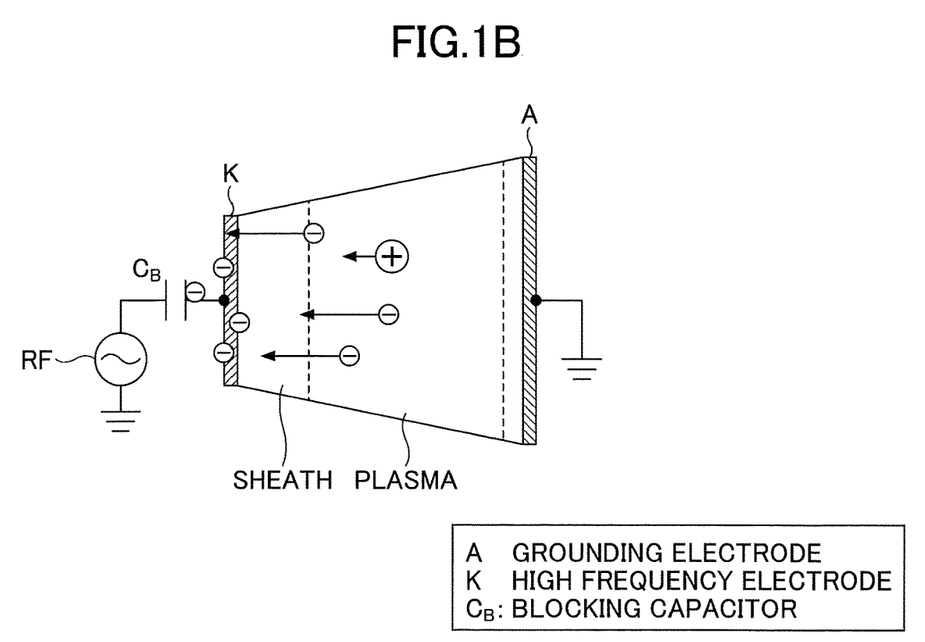

First, a self bias voltage of plasma (which is referred to as the "self bias voltage Vdc," hereinafter) is described by referring to FIGS. 1A and 1B. FIG. 1A schematically depicts a part of facing electrodes in which an electrode A and an electrode K are disposed to face each other. The electrode A is a grounding electrode that is connected to the earth, and the electrode K is a high frequency electrode that is coupled to a high frequency power source (RF power source) through a blocking capacitor $C_B$. An area of the electrode K is smaller than an area of the electrode A.

High frequency electric power RF is applied to the electrode K to ionize and dissociate a gas, and thereby plasma is generated. The high frequency electric power RF applied to the electrode K is such that a positive part and a negative part of a sine curve are symmetrical. Consequently, an electric potential of the electrode K is zero in total (i.e., averaged over an integral multiple of a period). From the generated plasma, electrons and cations are generated. As illustrated in FIG. 1B, when the electrode K is at a positive potential with respect to the plasma, electrons flow into the electrode K; and, when the electrode K is at a negative potential, cations flow into the electrode K.

At this time, the electrons can follow the high-speed potential fluctuation of the electrode K because the mass of each electron is small. As a result, the electrons flow into the electrode K. However, the mass of each cation is large, and the cations are unable to follow the high-speed potential fluctuation, and moves in a mean electric field in accordance with the law of inertia. As a result, an inflow of the cations into the electrode K is constant and very small.

The electrode K is floated from the ground (i.e., the electric potential of the electrode K is independent from the ground) by the blocking capacitor $C_B$, and, thus, the electrons that flow into the electrode K do not flow into the ground. Consequently, during a period (a half cycle) in which a surface of the electrode K is at a positive potential with respect to the plasma, electrons flow into the electrode K and the electrons are accumulated in the electrode K. However, due to the accumulated electrons, the surface of the electrode K is negatively charged, and a negative bias with respect to the plasma occurs. By the negative bias, cations tend to flow into the surface of the electrode K. As a result, a sheath is formed on the surface of the electrode K.

Ultimately, during one cycle, the surface of the electrode K is at a positive potential with respect to the plasma for a very short time interval out of the one cycle. The self bias voltage Vdc is direct-current (DC) component of an electric potential difference of the electrode K at a time at which the electrons that flow into the electrode K and the cations that constantly flow into the electrode K by the negative bias are in equilibrium.

In order to control an etching rate, a film formation rate, and so forth that represent characteristics of plasma processing, it is required to detect (recognize) a state of the plasma. Thus, in the embodiment, in order to detect a state of plasma inside the plasma processing device 100, the self bias voltage Vdc is measured.

[Configuration of the Plasma Processing Device]

Figure 2:
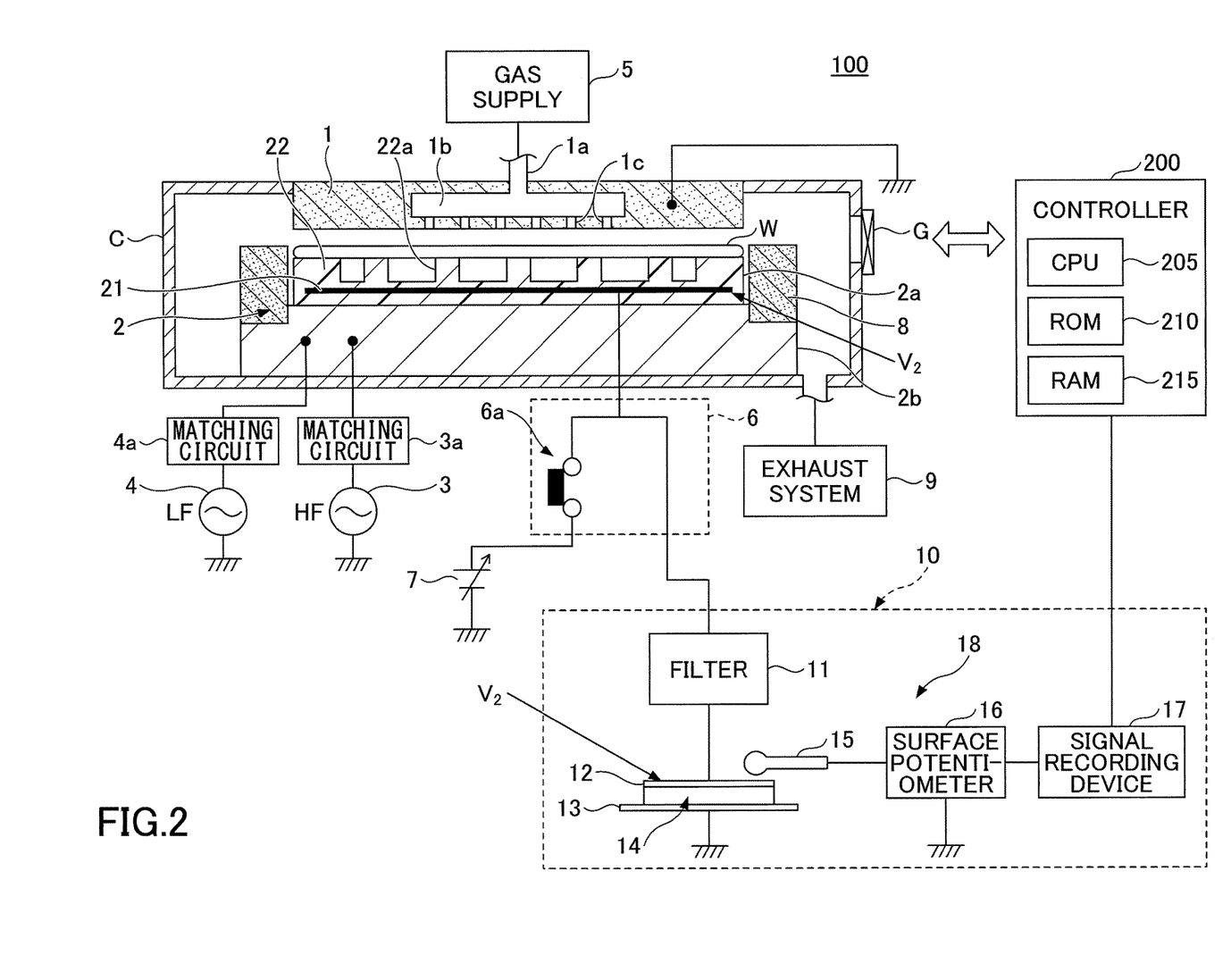
FIG. 2 is a diagram illustrating an example of a plasma processing device and an example of a measuring device according to an embodiment.

The plasma processing device 100 according to the embodiment illustrated in FIG. 2 is provided with a device main body; a relay box 6; and a measuring device 10. The measuring device 10 measures a voltage of an attraction electrode 21 in an electrostatic chuck 2a disposed inside a processing container C of the plasma processing device 100. The relay box 6 switches a connection destination of the attraction electrode 21 between a direct current power supply 7 and the measuring device 10. Upon detecting that a connection is established between the attraction electrode 21 and the measuring device 10, the measuring device 10 measures a voltage $V_2$ between a copper disk 12 and a copper plate 13, which represents a value corresponding to an electric charge amount accumulated in an acrylic plate 14 disposed between the copper disk 12 and the copper plate 13, as a DC component of the electric potential difference of the attraction electrode 21 of the electrostatic chuck 2a. Then, the measuring device 10 calculates the self bias voltage Vdc based on the measurement result. As a result, according to the embodiment, the self bias voltage Vdc can be easily and accurately measured only by attaching the relay box 6 and the measuring device 10 to the existing plasma processing device 100. In the following, an example of a configuration of the plasma processing device 100 and an example of a configuration of the measuring device 100 according to the embodiment are described.

(Configuration of the Plasma Processing Device)

The plasma processing device 100 according to the embodiment is a capacitively coupled parallel plate plasma processing device. The plasma processing device 100 according to the embodiment is provided with the processing container C having a substantially cylindrical shape. Alumite treatment (anodizing) is applied to an inner surface of the processing container C. An inner part of the processing container C is a processing chamber in which plasma processing is executed, such as an etching process, a film formation process, and so forth by plasma. A stage 2 is provided inside the processing container C.

In the stage 2, the electrostatic chuck 2a for electrostatically attracting a wafer W is provided on a base 2b. The base 2b is formed of, for example, aluminum (Al), titanium (Ti), silicon carbide (SiC), and so forth. The stage 2 also functions as a lower electrode.

The electrostatic chuck 2a has a structure such that the attraction electrode 21 exists inside a dielectric layer 22. A dot shaped convex part 22a is formed on a surface of the electrostatic chuck 2a. The attraction electrode 21 is connected to the relay box 6. When a switch 6a of the relay box 6 is connected to the direct-current power supply 7 and a direct-current voltage is supplied to the attraction electrode 21 from the direct-current power supply 7, a wafer W, which is an example of a substrate, is attracted and supported by the electrostatic chuck 2a by Coulomb force.

An annular focus ring 8 is placed on the upper part of an outer circumferential part of the electrostatic chuck 2a so that the focus ring 8 covers an outer edge part of the wafer W. For example, the focus ring 8 is formed of silicon. The focus ring 8 functions to enhance efficiency of the plasma processing by causing plasma to converge toward the surface of the wafer W.

First high frequency electric power (HF) with a first frequency is applied to the stage 2 from a first high frequency power supply 3, and second high frequency electric power (LF) with a second frequency is applied to the stage 2 from a second high frequency power supply 4. The first high frequency electric power (HF) is for generating plasma. The second high frequency electric power (LF) is for generating a bias voltage, and the second frequency of the second high frequency electric power (LF) is lower than the first frequency. The first high frequency power supply 3 is electrically connected to the stage 2 through a matching circuit 3a. The second high frequency power supply 4 is electrically connected to stage 2 through a matching circuit 4a. The first high frequency power supply 3 applies, for example, high frequency electric power HF with a frequency of 40 MHz to the stage 2. The second high frequency power supply 4 applies, for example, high frequency electric power LF with a frequency of 13.56 MHz to the stage 2. Note that, in the embodiment, the first high frequency electric power is applied to the stage 2. Alternatively, the first high frequency electric power may be applied to a gas shower head 1.

The matching circuit 3a is for matching a load impedance to an internal (or output) impedance of the first high frequency power supply 3. The matching circuit 4a is for matching a load impedance to an internal (or output) impedance of the second high frequency power supply 4.

The gas shower head 1 is attached to the processing container C so that the gas shower head 1 closes an opening of a ceiling part of the processing container C through a shield ring for covering an outer edge part of the gas shower head 1. The gas shower head 1 is grounded. The gas shower head 1 may be formed of silicon. The gas shower head 1 functions as a facing electrode (an upper electrode) that faces the stage 2 (a lower electrode).

In the gas shower head 1, a gas induction port 1a for inducing a gas is formed. Inside the gas shower head 1, a diffusion chamber 1b for diffusing a gas is formed. The gas output from a gas supply unit 5 is supplied to the diffusion chamber 1b through the gas induction port 1a. The gas is diffused in the diffusion chamber 1b, and the gas is induced from a plurality of gas supply ports 1c into the processing container C.

An exhaust port is formed in the bottom surface of the processing container C, and a gas in the processing container C is exhausted by an exhaust system 9 connected to the exhaust port. As a result, the inner part of the processing container C can be maintained at a predetermined degree of vacuum. On a side wall of the processing container C, a gate valve G is provided. The gate valve G opens and closes when the wafer W is loaded to the processing container C or when the wafer W is unloaded from the processing container C.

After supplying a processing gas from the gas supply unit 5 into the processing container C, when the first high frequency electric power and the second high frequency electric power are applied to the stage 2 from the first high frequency power supply 3 and the second high frequency power supply 4, respectively, plasma is generated and a predetermined plasma process is applied to the wafer W. In particular, when the second high frequency electric power is applied to the stage 2 from the second high frequency power supply 4, ions in the plasma are attracted toward the wafer W.

Subsequent to the plasma processing, a direct-current voltage with a polarity opposite to the polarity of the direct-current voltage for attracting the wafer W is applied to the attraction electrode 21 from the direct-current power supply 7, and the electric charge on the wafer W is removed. As a result, the wafer W is removed from the electrostatic chuck 2a, and the wafer W is taken out from the processing container C through the gate valve G.

The plasma processing device 100 is provided with a controller 200 for controlling the operation of the entire device. The controller 200 is provided with a central processing unit (CPU) 205; a read-only memory (ROM) 210; and a random access memory (RAM) 215. The CPU 205 executes a desired process, such as etching, in accordance with a recipe stored in a storage area of the RAM 215, etc. In the recipe, control information of a device with respect to a processing condition is configured, such as a process time, pressure (for evacuating a gas), high frequency electric power, a voltage, flow rates of various types of gases, a temperature inside the processing container (a temperature of the upper electrode, a temperature of a side wall of the processing container, a temperature of the wafer W, a temperature of the electrostatic chuck, etc.), and a temperature of a coolant.

Additionally, the controller 200 switches the switch 6a of the relay box 6 at a predetermined timing so as to connect the attraction electrode 21 to the measuring device 10. The voltage $V_2$ measured by the measuring device 10 is transmitted to the controller 200. Then, the controller 200 calculates the self bias voltage Vdc based on the voltage $V_2$.

Here, a program for executing these operations and the recipe representing the processing condition may be stored in a hard disk or a semiconductor memory. Additionally, the recipe may be stored in a portable storage medium readable by a computer, such as a CD-ROM and a DVD. In this case, the portable storage medium may be set at a predetermined position, so that the recipe can be readout.

(Configuration of the Measuring Device)

Next, an example of a configuration of the measuring device 10 is described. The measuring device 10 is provided with a filter 11; the copper disk 12; the copper plate 13; the acrylic plate 14; a probe 15; a surface potentiometer 16; and a signal recording device 17. The probe 15 and the surface potentiometer 16 form a potential measurement system 18.

For convenience of the description, in FIG. 2, the relay box 6 is illustrated as a device separated from the measuring device 10. However, the relay box 6 is actually included in the measuring device 10. The relay box 6 switches a connection of the attraction electrode 21 between the direct-current power supply 7 and a component with electrostatic capacitance, which is a part of the measuring device 10. The relay box 6 connects the switch 6a of the relay box 6 to the measuring device 10 at a timing for measuring the self bias voltage Vdc. The relay box 6 is an example of a switch for switching a connection of the attraction electrode 21, to which the high frequency electric power is applied, to the component with the electrostatic capacitance. The component with the configuration such that the acrylic plate 14 is disposed between the copper disk 12 and the copper plate 13 is an example of the component with the electrostatic capacitance. The configuration of the component with the electrostatic capacitance is not limited to the configuration including the copper disk 12, the copper plate 13, and the acrylic plate 14. The component with the electrostatic capacitance may be formed of an isolated electric conductor.

In the potential measurement system 18, an electric potential generated in the acrylic plate 14 disposed between the copper disk 12 and the copper plate 13 is measured by the surface potentiometer 16 using the probe 15 placed above a surface of the copper disk 12. The probe 15 is placed above the surface of the copper disk 12 so that the probe 15 does not contact the surface of the copper disk 12. The potential measurement system 18 is an example of a measurement device for measuring a value corresponding to an electric charge amount accumulated in the component with the electrostatic capacitance. The probe 15 may contact the copper disk 12 or may not contact the copper disk 12, provided that a potential difference between the copper disk 12 and the copper plate 13 can be measured.

The filter 11 for removing the high frequency electric power is provided between the relay box 6 and the component with the electrostatic capacitance. The filter 11 prevents the high frequency electric power from transmitting toward the measuring device 10. When the switch 6a of the relay box 6 is switched from a side for connecting to the direct-current power supply 7 to a side for connecting to the component with the electrostatic capacitance of the measuring device 10, a voltage $V_2$ generated in the component with the electrostatic capacitance, i.e., the voltage $V_2$ of the attraction electrode 21 in a floating state (i.e., the voltage of the attraction electrode 21 is independent from the ground) can be measured.

Specifically, the copper plate 13 is grounded, and the electric potential measured by the surface potentiometer 16 using the probe 15 is the voltage $V_2$ of the attraction electrode 21 in the floating state. Here, the probe 15 is placed above the surface of the copper disk 12 so that the probe 15 does not contact the surface of the copper disk 12. A diameter of the copper disk 12 may be, for example, approximately 100 mm. However, the diameter of the copper disk 12 is not limited to this.

The voltage $V_2$ measured by the surface potentiometer 16 is stored in the signal recording device 17 connected to the surface potentiometer 16. The signal recording device 17 may be an electronic device provided with a memory, such as a personal computer (PC) and a tablet terminal, or the signal recording device 17 may be a cloud computer installed on a cloud. The measured voltage $V_2$ recorded in the signal recording device 17 is transmitted to the controller 200. The controller 200 uses the measured voltage $V_2$ to control an etching rate and a film formation rate of the plasma processing device 100.

Moisture affects the electric charge amount accumulated in the component with the electrostatic capacitance. Accordingly, the copper disk 12, the copper plate 13, the acrylic plate 14, and the probe 15 may preferably be installed in a vacuum container. By placing the copper disk 12, the copper plate 13, the acrylic plate 14, and the probe 15 in a vacuum environment, the voltage $V_2$ can be accurately measured without receiving a disturbance effect caused by an external environment.

[Measurement Timing]

Figure 3:
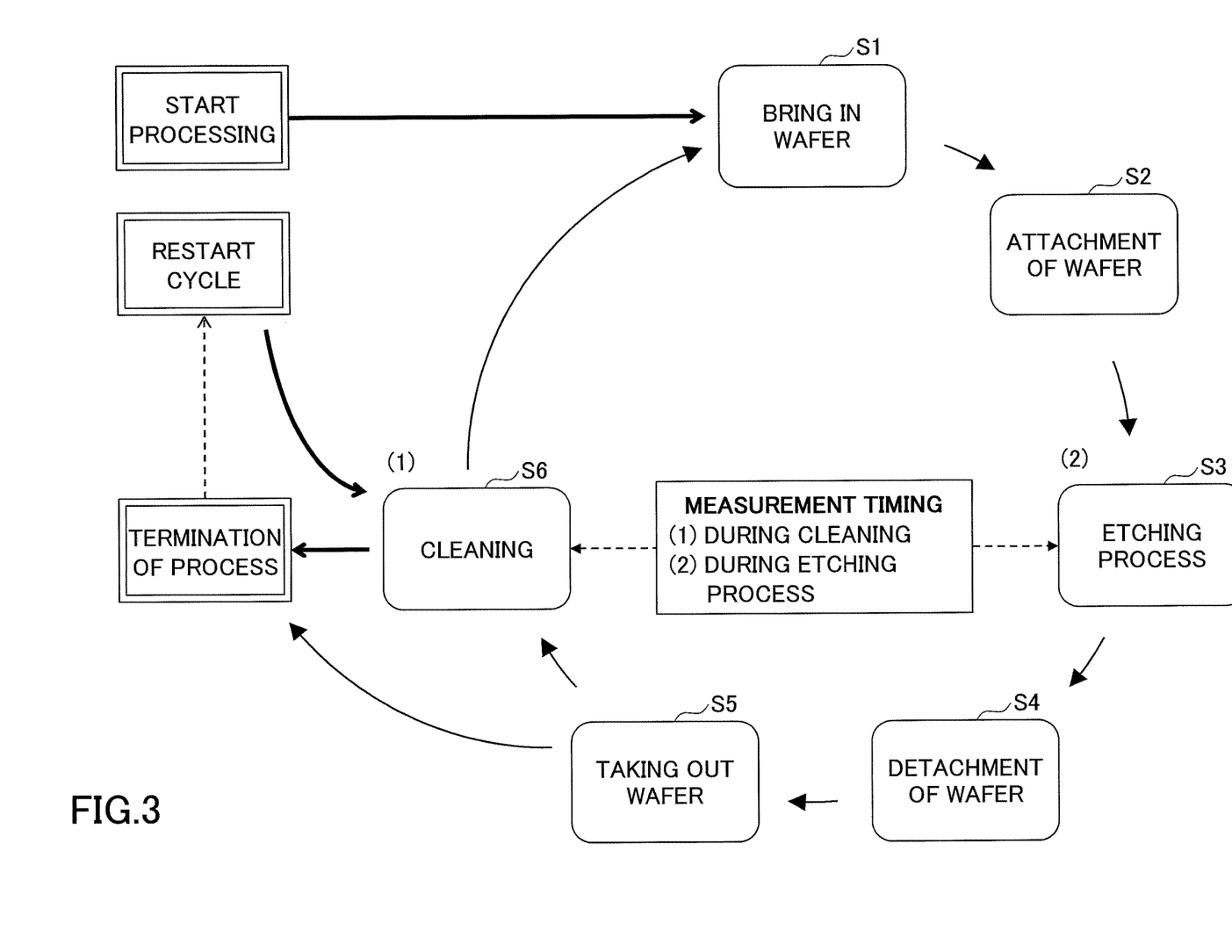
FIG. 3 is a diagram illustrating a timing for measuring the self bias voltage according to the embodiment.

FIG. 3 shows an example of a processing cycle for processing the wafer W in the plasma processing device 100. When the process is started, first, the wafer W is loaded from the gate valve G of the plasma processing device 100 (step S1). Next, a predetermined direct-current voltage is supplied from the direct-current power supply 7 to the attraction electrode 21, and the wafer W is electrostatically attracted by the electrostatic chuck 2a (step S2). Next, high frequency electric power is applied to the stage 2 (the attraction electrode 21) to convert a process gas supplied from the gas supply 5 into plasma, and plasma processing, such as an etching process, is applied to the wafer W (step S3). The etching process is an example of substrate processing by plasma. The high frequency electric power may be any one of or both of the high frequency electric power HF output from the first high frequency power supply 3 and the high frequency electric power LF output from the second high frequency power supply 4.

Next, a direct-current voltage having the same amplitude and the opposite polarity as those of the direct current voltage applied to the attraction electrode 21 at step 2 is supplied to the attraction electrode 21, the wafer W is removed from the electrostatic chuck 2a (step S4), and the wafer W is unloaded from the gate valve G of the plasma processing device 100 (step S5). Subsequently, a cleaning process is executed (step S6).

At this time point, the processing of one wafer W is completed, and one processing cycle is completed. When the processing cycle is restarted for the next wafer W, surface treatment (cleaning, such as treatment) of the electrostatic chuck 2a is performed (step S6), the next wafer W is loaded (step S1), and the processing on and after step S1 is repeated.

In the above-described cycle, the relay box 6 switches the connection of the attraction electrode 21 to the measuring device 10 at (1) the cleaning process (S6) and (2) the etching process (S3). Namely, during execution of the processing of the wafer W by the plasma or during execution of the cleaning process, the relay box 6 switches the connection of the attraction electrode 21 to the measuring device 10, and the potential measurement system 18 measures the voltage $V_2$ of the attraction electrode 21 in the floating state.

[Measurement Sequence]

Figure 4:
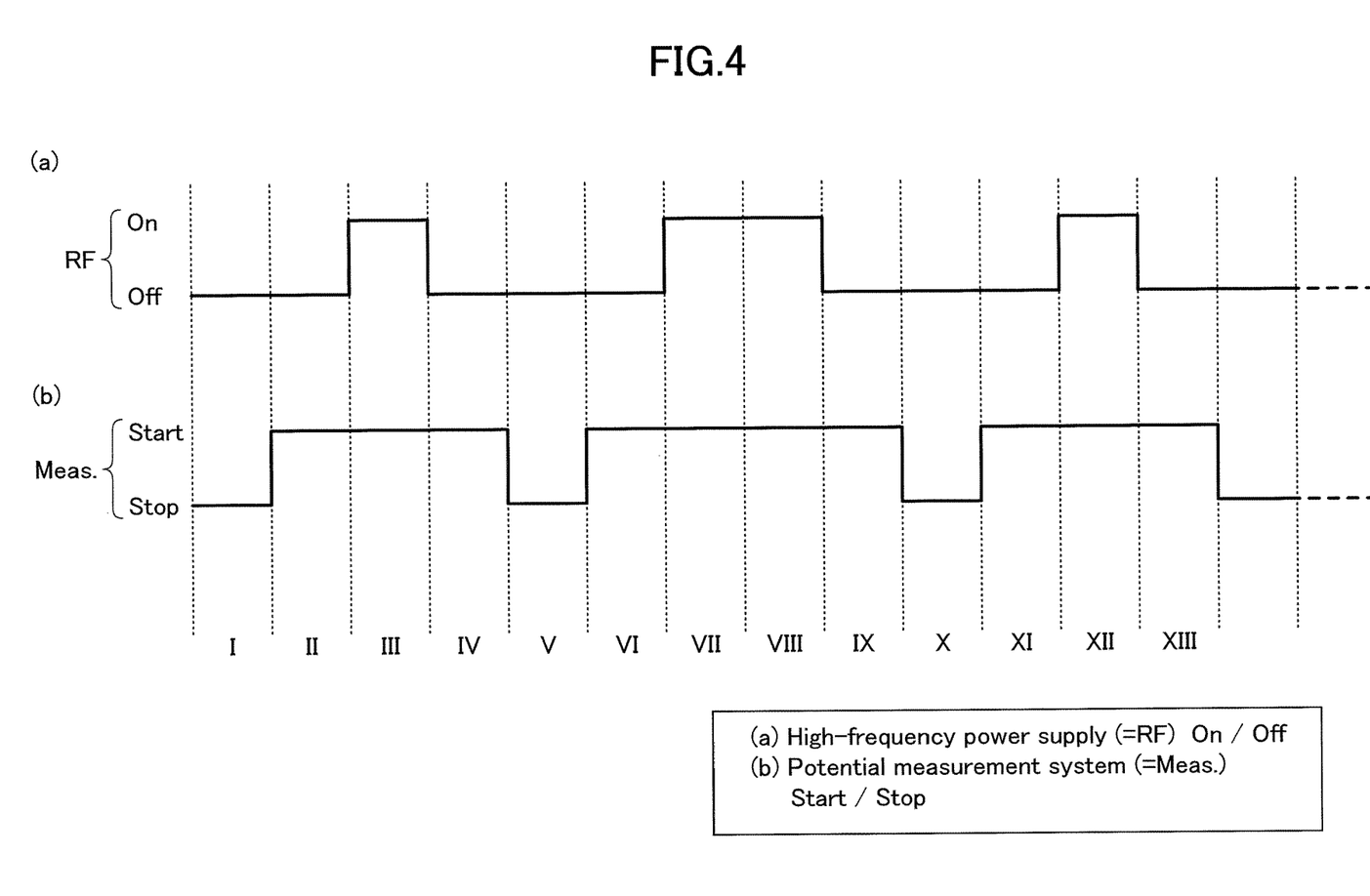
FIG. 4 is a diagram illustrating an example of a measurement sequence for measuring the self bias voltage according to the embodiment.
Figure 5:
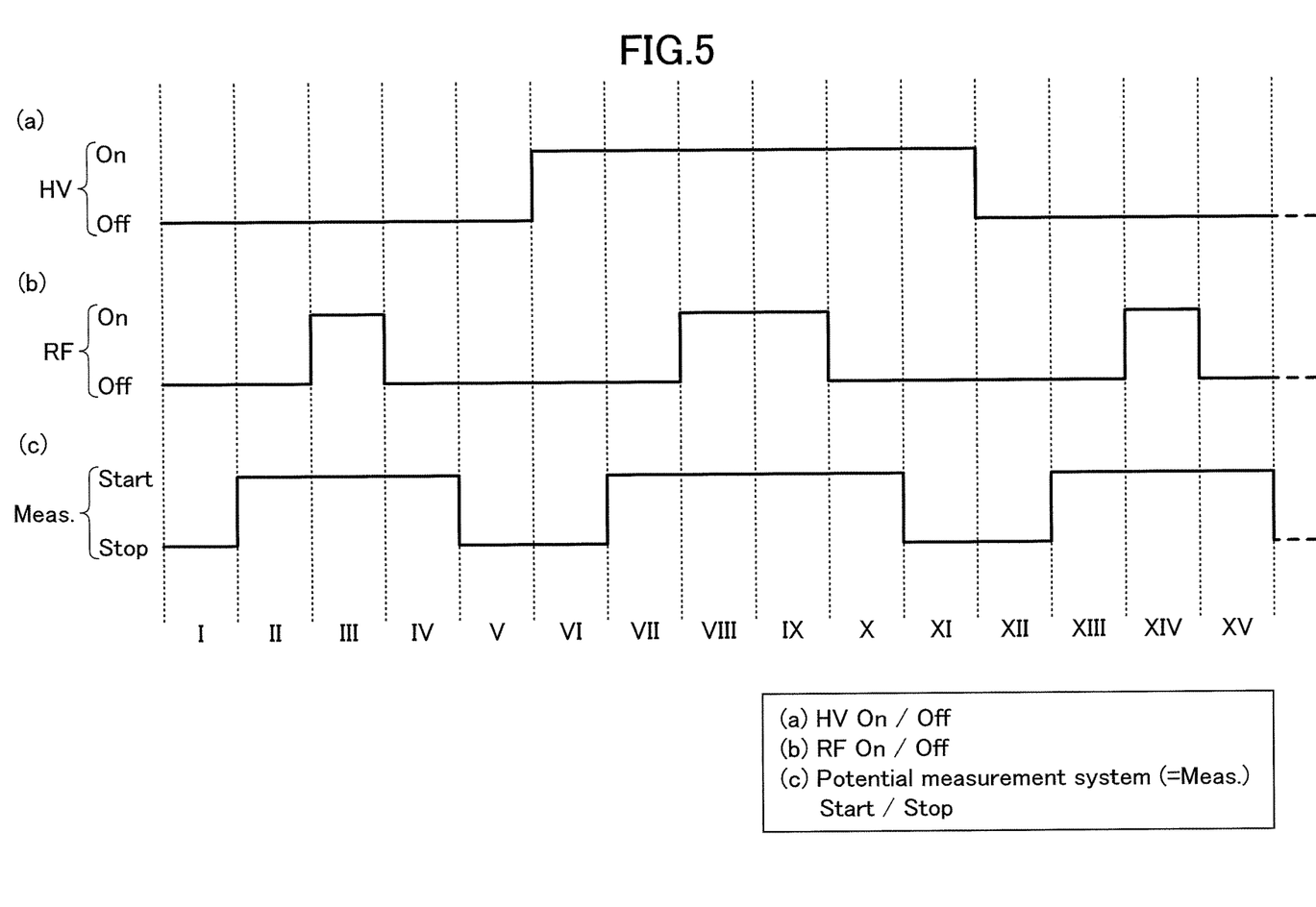
FIG. 5 is a diagram illustrating another example of the measurement sequence for measuring the self bias voltage according to the embodiment.

Next, an example of a measurement sequence in (1) the cleaning process and an example of a measurement sequence in (2) the etching process are described by referring to the measurement sequence charts of FIG. 4 and FIG. 5. FIG. 4 illustrates an example of the measurement sequence of the cleaning process. FIG. 5 illustrates an example of the measurement sequence of the etching process. The controller 200 controls the measurement sequence in the cleaning process and the etching process.

(1) The Measurement Sequence in the Cleaning Process

The measurement sequence in the cleaning process illustrated in FIG. 4 is used during waferless dry cleaning (WLDC) or during waferless (WLT) treatment. When the measurement sequence is started, the attraction electrode 21 is turned off, namely, the attraction electrode 21 is not connected to the direct-current power supply 7, and the attraction electrode 21 is in a state in which the attraction electrode 21 is connected to the ground (reference potential).

In this state, the measurement sequence is started at step I of FIG. 4. At step II, the switch 6a of the relay box 6 is switched to the side for connecting to the measuring device 10. As a result, the connection of the attraction electrode 21 is switched to the measuring device 10, and the attraction electrode 21 is in the floating state.

Subsequently, the high frequency electric power is applied at step III, the voltage $V_2$ of the copper disk 12 is measured by the surface potentiometer 16 using the probe 15 in the potential measurement system 18, and the voltage $V_2$ is recorded by the signal recording device 17. Subsequently, the application of the high frequency electric power is terminated at step IV, and, at step V, the switch 6a of the relay box 6 is switched to the side for connecting to the direct-current power supply 7 and the measurement sequence is terminated. The above-described measurement sequence is repeated.

(2) The Measurement Sequence in the Etching Process

The measurement sequence in the etching process illustrated in FIG. 5 is used when the wafer W is placed on the electrostatic chuck 2a and plasma processing, such as etching, is applied. When the measurement sequence is started, the attraction electrode 21 is turned on, namely, the attraction electrode 21 is connected to the direct-current power supply 7.

In this state, the measurement sequence is started at step I of FIG. 5. At step II, the switch 6a of the relay box 6 is switched to the side for connecting to the measuring device 10. As a result, the connection of the attraction electrode 21 is switched to the measuring device 10, and the attraction electrode 21 is in the floating state.

Subsequently, the high frequency electric power is applied at step III, the voltage $V_2$ of the copper disk 12 is measured by the surface potentiometer 16 using the probe 15 in the potential measurement system 18, and the voltage $V_2$ is recorded by the signal recording device 17. Subsequently, the application of the high frequency electric power is terminated at step IV, and, at step V, the switch 6a of the relay box 6 is switched to the side for connecting to the direct-current power supply 7 and the measurement sequence is terminated. When the above-described measurement sequence is repeated, during plasma processing, the direct-current voltage HV is applied to the attraction electrode 21 at step VI, the measurement sequence from step VII to step XI is executed after the stage 2 electrostatically attracting the wafer W, and the application of the direct-current voltage HV to the attraction electrode 21 is terminated at step XII and the attraction of the wafer W is terminated. The measurement sequence from step VII to step XI is the same as the above-described measurement sequence from step II to step V.

As described above, the relay box 6 switches the connection of the attraction electrode 21 between the direct-current power supply 7 and the measuring device 10. When the switch 6a of the relay box 6 is switched to the measuring device 10, the attraction electrode 21 is in the floating state, and, subsequently, the high frequency electric power is applied and the gas in the plasma processing space of the plasma processing device 100 is converted into plasma.

After the application of the high frequency electric power, the surface potentiometer 16 measures the voltage $V_2$ of the copper disk 12 using the probe 15, and the controller 200 calculates the self bias voltage Vdc based on the measured voltage $V_2$. In the following, a method of calculating the self bias voltage Vdc based on the measured voltage $V_2$ is described. [Method of Calculating the Self Bias Voltage Vdc]

Figure 6:
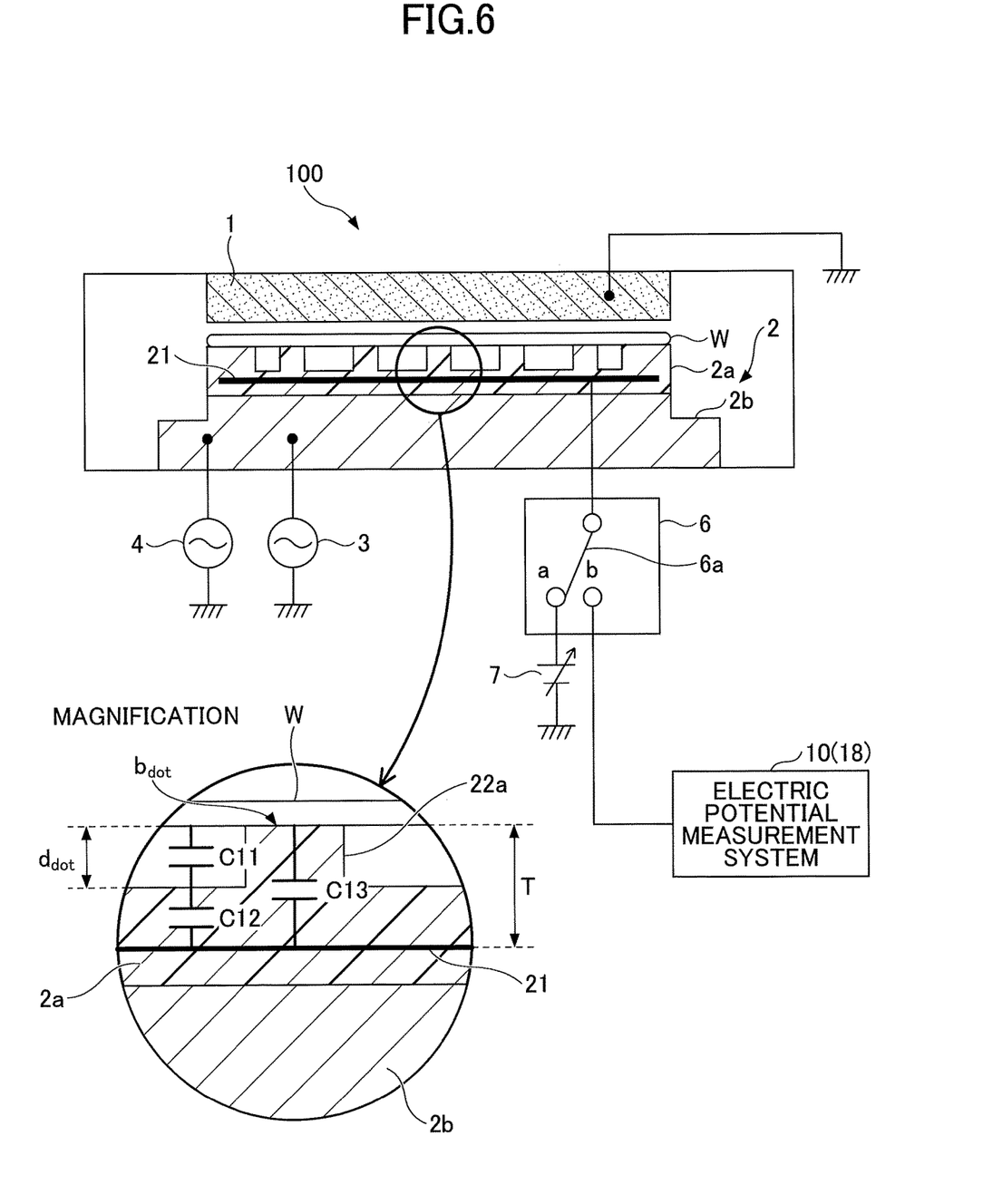
FIG. 6 is a diagram illustrating an example of a model used for calculation of the self bias voltage according to the embodiment.

FIG. 6 shows an example of a model used for calculating the self bias voltage Vdc according to the embodiment. As shown in an enlarged view of a part of the surface of the electrostatic chuck 2a in FIG. 6, an area of an upper surface of the dot-shaped convex part 22a formed on the surface of the electrostatic chuck 2a is denoted as $b_{dot}$, and the height of the convex part 22a is denoted as $d_{dot}$. Additionally, the height from the attraction electrode 21 to the upper surface of the dot is denoted as T, and an area ratio of the area of the surface of the electrostatic chuck 2a with respect to the area of the upper surface of the convex part 22a is denoted as $a_{e1}$.

The electrostatic capacitance of the space of the electrostatic chuck 2a between the dot shaped convex parts 22a is denoted as $C_{11}$; the electrostatic capacitance between the electrostatic chuck 2a and the attraction electrode 21 below the space between the dot-shaped convex parts 22a is denoted as $C_{12}$; and the electrostatic capacitance between the upper surface of the convex part 22a and the attraction electrode 21 is denoted as $C_{13}$.

The electrostatic capacitance $C_{11}$ is calculated from the following formula (1).

[Expression 1]
$$C_{11} = \frac{\varepsilon_0(1 - a_{e1})S}{d_{dot}} \tag{1}$$

The electrostatic capacitance $C_{12}$ is calculated from the following formula (2).

[Expression 2]
$$C_{12} = \frac{\varepsilon_0\varepsilon_r a_{e1}(1 - b_{dot})S}{T - d_{dot}} \tag{2}$$

The electrostatic capacitance $C_{13}$ is calculated from the following formula (3).

[Expression 3]
$$C_{13} = \frac{\varepsilon_0\varepsilon_r a_{e1} b_{dot}}{T} \tag{3}$$

In the formula (1) through the formula (3), $\varepsilon_0$ represents the dielectric constant of vacuum, $\varepsilon_r$ represents the relative dielectric constant, namely, the ratio between the dielectric constant $\varepsilon$ of the dielectric layer of the electrostatic chuck 2a and the dielectric constant of vacuum $\varepsilon_0$ ($=\varepsilon/\varepsilon_0$), and S represents the area of the attraction electrode 21.

The values of the electrostatic capacitance $C_{11}$, $C_{12}$, and $C_{13}$ are fixed values obtained from design parameters. Thus, the electrostatic capacitance $C_1$ of the electrostatic chuck 2a can be calculated as a fixed value by substituting the values of the electrostatic capacitance $C_{11}$, $C_{12}$, and $C_{13}$ in the following formula (4).

[Expression 4]
$$C_1 = \left(\frac{1}{C_{11}} + \frac{1}{C_{12}}\right)^{-1} + C_{13} \tag{4}$$

Using the calculated electrostatic capacitance $C_1$ of the electrostatic chuck 2a, the voltage $V_1$ that is applied to the electrostatic chuck 2a shown in FIG. 7, which is an equivalent circuit of the model of FIG. 6, and the electric charge $q_1$ accumulated in the electrostatic chuck 2a, the relation of the formula (5) below holds by Coulomb's law.

$$C_1 V_1 = q_1 \tag{5}$$

Here, $C_2$ is the electrostatic capacitance between the copper disk 12 and the copper plate 13 (ground), $C_3$ is the electrostatic capacitance of the filter 11, and $V_2$ is the voltage applied between the copper disk 12 and the copper plate 13 and the voltage applied to the filter 11. Additionally, if the electric charge accumulated between the copper disk 12 and the copper plate 13 is denoted by $q_2$ and the electric charge accumulated in the filter 11 is denoted by $q_3$, the relation of the formula (6) below holds by Coulomb's law.

Note that the electrostatic capacitance $C_2$ is a fixed value obtained from design parameters determined by the configuration of the copper disk 12, the copper plate 13, and the acrylic plate 14. Similarly, the electrostatic capacitance $C_3$ is a fixed value obtained from design parameters determined by the configuration of the filter 11. Note that the values of the electrostatic capacitance $C_1$, $C_2$, and $C_3$ can be determined, not only by the fixed values determined by the design parameters, but also by actual measurement values obtained by measurement.

$$(C_2+C_3)V_2 = q_2+q_1 \quad (6)$$

The relation of the formula (7) holds among the electric charge $q_1$ accumulated in the electrostatic chuck $2a$, the electric charge $q_2$ accumulated between the copper disk 12 and the copper plate 13, and the electric charge $q_3$ accumulated in the filter 11.

$$q_1-(q_2+q_3)=0 \quad (7)$$

The formula (7) can be expressed as follows.

$$q_1=(q_2+q_3) \quad (8)$$

By substituting the formula (5) and the formula (6) in the formula (8), the formula (9) is obtained.

$$C_1V_1=(C_2+C_3)V_2 \quad (9)$$

From the formula (9), the formula (10) and the formula (11) can be obtained.

$$V_1=V_2\times(C_2+C_3)/C_1 \quad (10)$$

$$V_2=V_1\times C_1/(C_2+C_3) \quad (11)$$

Figure 7:
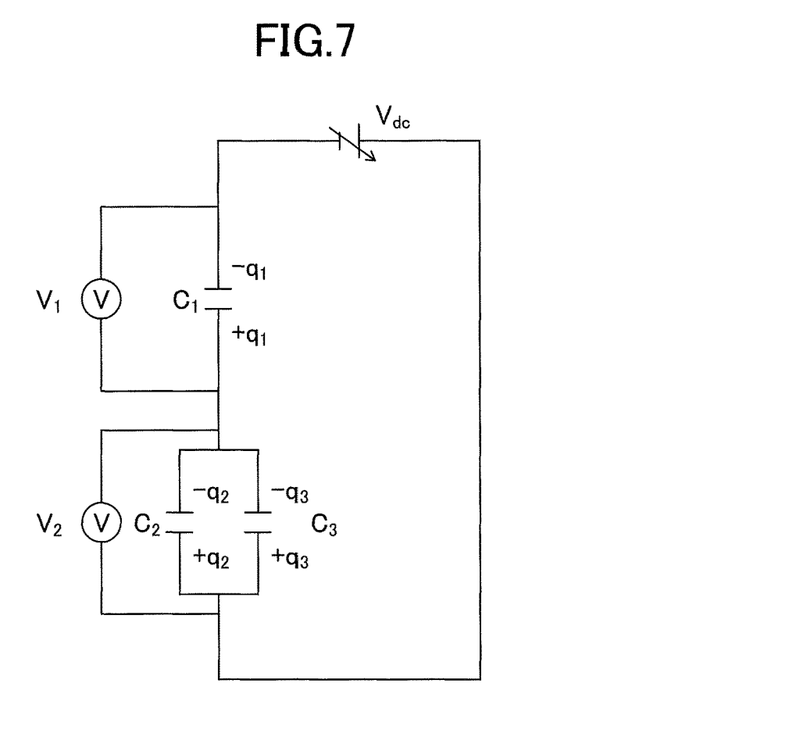
FIG. 7 is a diagram illustrating an example of an equivalent circuit of a model according to the embodiment.

From the formula (10) and the formula (11), the self bias voltage $V_{dc}$ of FIG. 7 can be calculated by the formula (12).

$$V_{dc}=V_1+V_2 \quad (12)$$

By substituting the formula (10) in the formula (12), the formula (13) can be obtained.

$$V_{dc}=V_2\times(C_2+C_3)/C_1+V_2 \quad (13)$$

By substituting the voltage $V_2$ measured by the measuring device 10 and the values of the electrostatic capacitance $C_1$, $C_2$, and $C_3$, which are fixed values, in the formula (13), the self bias voltage $V_{dc}$ can be calculated. The electrostatic capacitance $C_1$ is a combined capacitance value of $C_{11}$, $C_{12}$, and $C_{13}$ obtained by the formula (4). The values of the electrostatic capacitance $C_1$, $C_2$, and $C_3$ are fixed values determined by the design parameters.

As described above, according to the measurement method of the embodiment, the self bias voltage $V_{dc}$ can be easily and accurately derived from the voltage $V_2$ that is the measured value of the surface potentiometer 16, the electrostatic capacitance $C_1$ of the electrostatic chuck $2a$, the electrostatic capacitance $C_2$ of the component with the electrostatic capacitance, and the electrostatic capacitance $C_3$ of the filter 11, based on the formula (13).

[Measurement Result]

Figure 8:
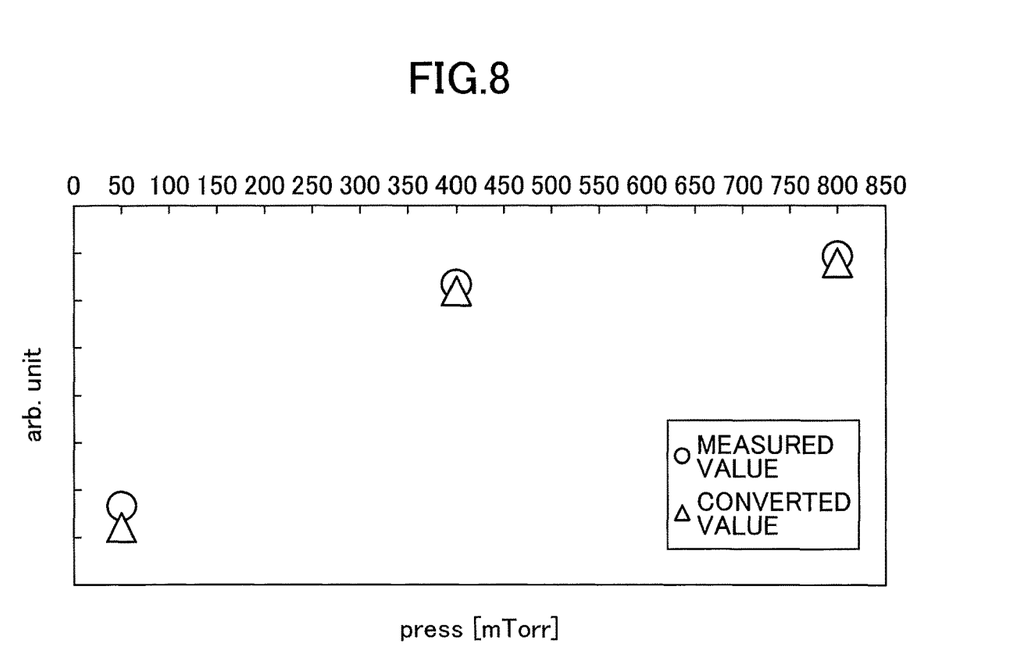
FIG. 8 is a diagram illustrating an example of a measurement result of the self bias voltage according to the embodiment.

FIG. 8 shows an example of the measurement result of the voltage $V_2$ by the measuring device 10 according to the embodiment and an example of the self bias voltage $V_{dc}$ calculated from the voltage $V_2$. The horizontal axis of FIG. 8 represents pressure inside the processing container C of the plasma processing device 100. FIG. 8 shows the measured values of the voltage $V_2$, which were measured by the measuring device 10 while varying the pressure inside the processing container C. Additionally, FIG. 8 shows the values of the self bias voltage Vdc, which were obtained based on the formula (13) by converting the values of the electrostatic capacitance $C_1$, $C_2$ and $C_3$ and the measured values of the voltage $V_2$.

According to the measurement result, one-to-one correspondence is established between the measured values and the converted values at the three points, regardless of the change in the pressure inside the processing container C. Namely, it can be seen that the voltage of the attraction electrode 21 in the floating state can be measured by the potential measurement system 18 using the component with the electrostatic capacitance, and that the self bias voltage $V_{dc}$ can be accurately measured using the measured voltage $V_2$. Furthermore, from the formula (13), it can be seen that, as the electrostatic capacitance $C_2$ of the component with the electrostatic capacitance and the electrostatic capacitance $C_3$ of the filter 11 become smaller, the measured voltage $V_2$ (measured value) and the self bias voltage $V_{dc}$ (converted value) become closer to each other.

As described above, according to the embodiment, the self bias voltage $V_{dc}$ can be easily measured only by attaching the switch and the measuring device to the plasma processing device, without changing the design of the plasma processing device.

[Measurement Method]

A shift and a crack of the wafer W are caused by electric charges remaining on the surface of the electrostatic chuck $2a$. The residual attraction state of the surface of the electrostatic chuck $2a$ which can be a cause of the shift and the crack of the wafer W, namely, the voltage $V_2$ that indicates easiness to store electric charges or a charged state can be measured by the above-described measuring device 10, and the self bias voltage $V_{dc}$ can be calculated based on the formula (13).

The measurement of the voltage $V_2$ and the calculation of the self-bias voltage $V_{dc}$ are performed in the state of the electrostatic chuck $2a$ prior to loading the wafer W. Then, depending on the calculated self bias voltage $V_{dc}$, the residual attraction state of the surface of the electrostatic chuck $2a$ at that time point is determined, and the cleaning processing time of the electrostatic chuck $2a$ and presence or absence of execution of the maintenance, etc., of the electrostatic chuck $2a$, which is performed while opening the processing container C, are controlled. As described above, by determining, in advance, the residual attraction state of the surface of the electrostatic chuck $2a$ based on the calculated self bias voltage $V_{dc}$ without mounting the wafer W, the risk of braking the wafer W due to the rise of the pusher pins at the time of unloading the wafer W can be eliminated.

Usually, the surface potential of the electrostatic chuck $2a$ is measured by detecting the residual attraction by finding the level of the pin torque during raising the pusher pins for unloading the wafer W, or by inserting a probe or a sensor. In contrast, according to the above-described measurement method, the residual attraction state of the surface of the electrostatic chuck $2a$ can be determined depending on the value of the self bias voltage $V_{dc}$ while suppressing the risk of braking the wafer W, and it can be determined as to whether the maintenance is to be executed. As a result, a guideline for optimizing the operation method and for improving the operation can be obtained based on the determination result, such as the frequency of cleaning performed depending on the self bias voltage Vdc, the cleaning processing time, the timing for executing any other maintenance, etc.

Figure 9:
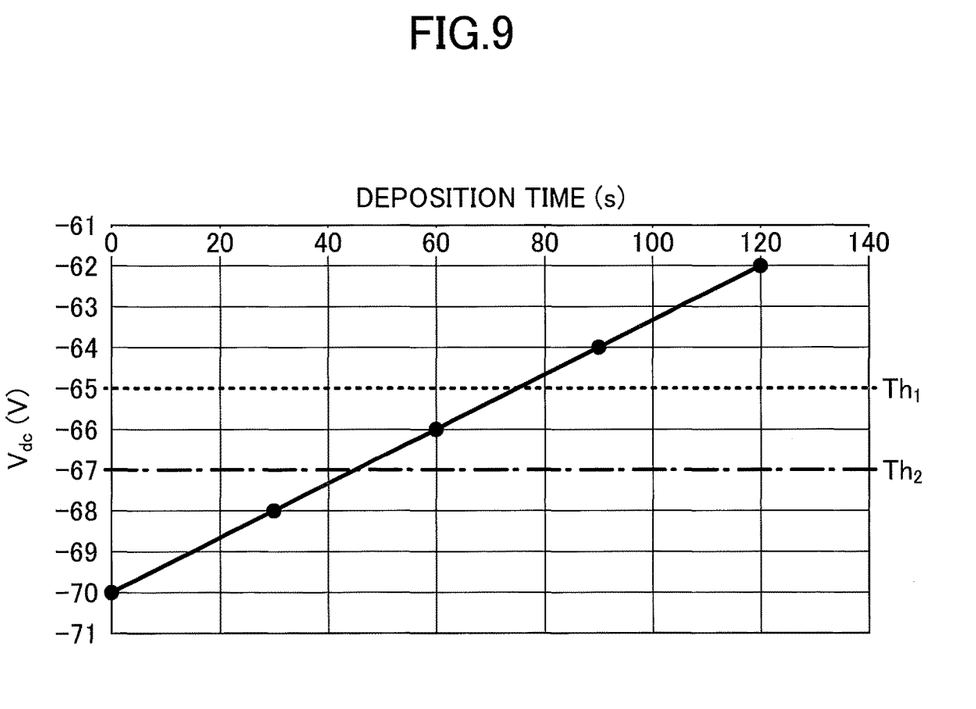
FIG. 9 is a diagram illustrating an example of correlation information between the self bias voltage and a deposition time according to the embodiment.
Figure 10:
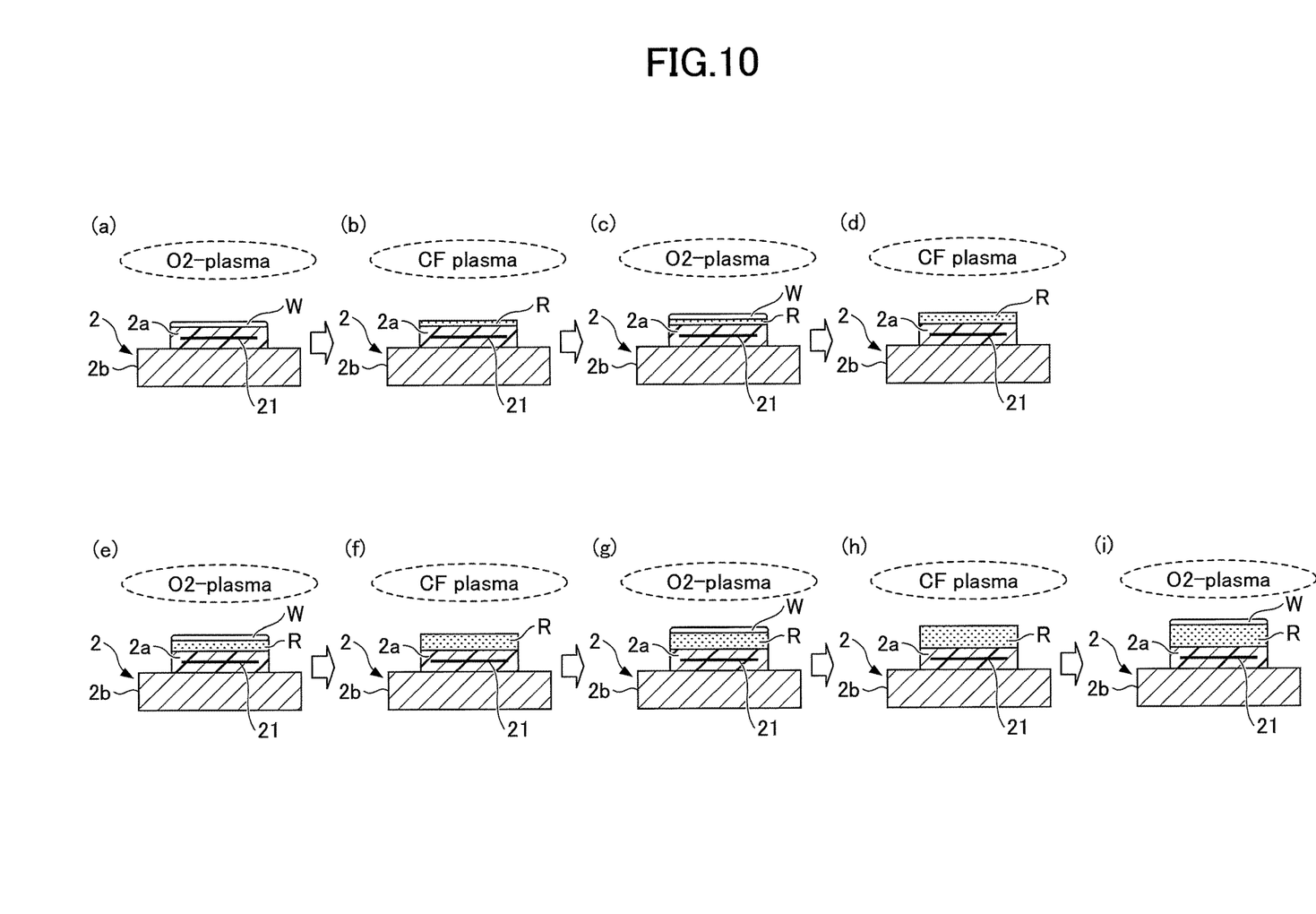
FIG. 10 is a diagram illustrating an example of measurement that is performed in advance to collect the correlation information of FIG. 9.
Figure 11:
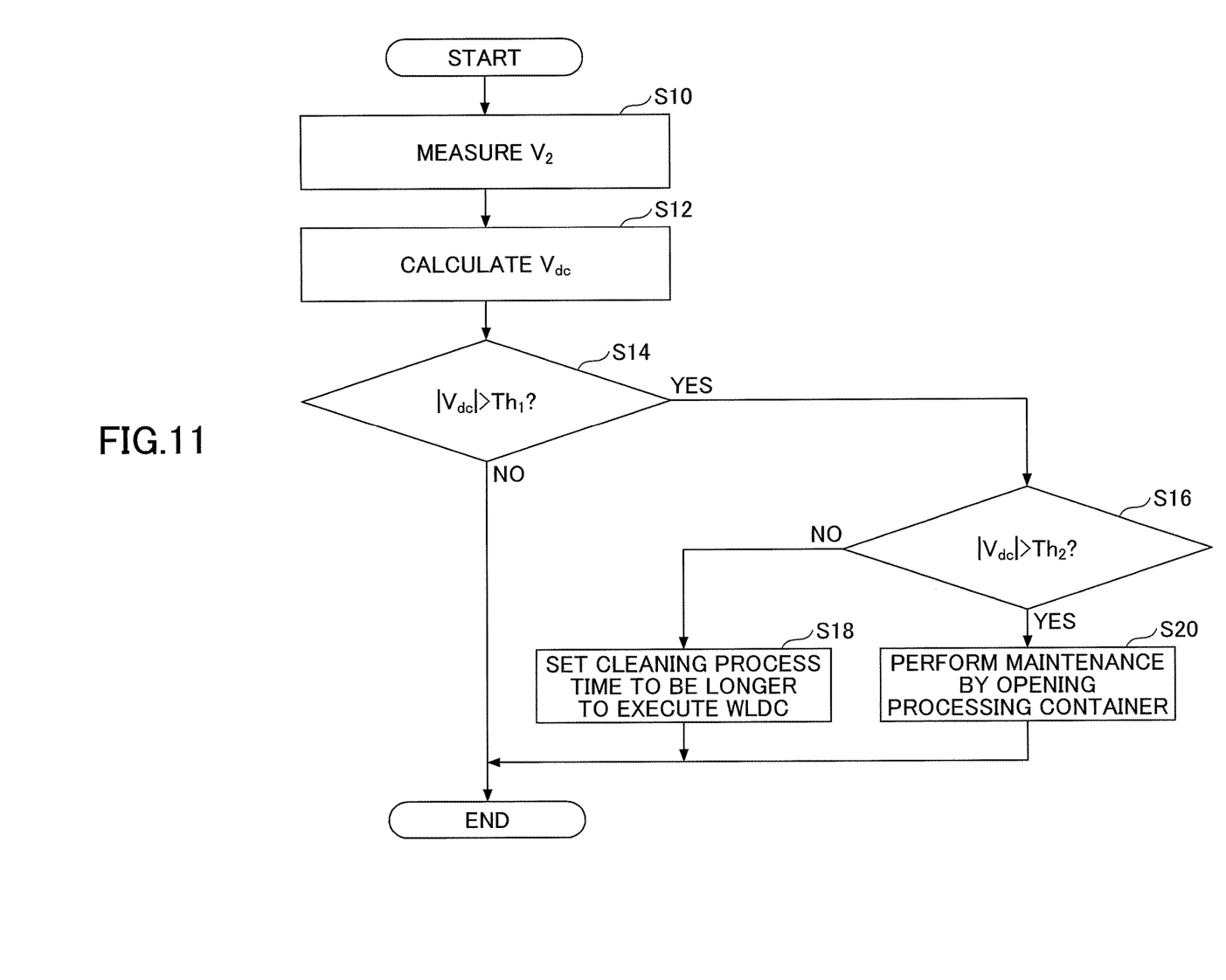
FIG. 11 is a flow chart illustrating an example of a measurement method according to the embodiment.

For example, by referring to FIG. 9 through FIG. 11, an example of the measurement method according to the embodiment including the above-described determination is described. FIG. 9 is a diagram showing a graph illustrating an example of the correlation information between the self bias voltage $V_{dc}$ and the deposition time according to the embodiment. FIG. 10 is a diagram illustrating an example of a process to be performed in advance for collecting the correlation information. The example of the correlation information is shown in the graph of FIG. 9. FIG. 11 is a flowchart illustrating an example of the measurement method according to the embodiment.

In FIG. 9, the correlation information between an accumulated value of the deposition time on the horizontal axis and the self bias voltage $V_{dc}$ on the vertical axis is derived based on the measured voltage $V_2$ between the copper disk 12 and the copper plate 13. The accumulated value of the deposition time of the deposit on the horizontal axis is equal to the accumulated value of the application time of the high frequency power applied by supplying the deposition gas, and the accumulated value of the deposition time is proportional to the thickness of the deposit deposited on the surface of the electrostatic chuck 2a. The accumulated value of the deposition time on the horizontal axis is an example of a value representing the residual attraction state of the electrostatic chuck 2a. However, the value representing the residual attraction state of the electrostatic chuck 2a is not limited to the accumulated value of the deposition time. The value representing the residual attraction state of the electrostatic chuck 2a may be a measured value of the thickness of the deposit on the electrostatic chuck 2a, or an accumulated value of the application time of the high frequency power.

The self bias voltage $V_{dc}$ on the vertical axis is an example of the value corresponding to the measured electric charge amount. The value corresponding to the measured electric charge amount is not limited to the self bias voltage $V_{dc}$ calculated from the voltage $V_2$, and the value corresponding to the measured electric charge amount may be the measured voltage $V_2$.

In the embodiment, the correlation information between the accumulated value of the deposition time and the self bias voltage $V_{dc}$ of FIG. 9 is derived by the process from (a) to (i) of FIG. 10. However, the graph representing the correlation between the value corresponding to the measured charge amount and the value indicating the residual attraction state of the electrostatic chuck 2a is not limited to a straight line.

For example, in the process of FIG. 10(a), the wafer W is placed on the electrostatic chuck 2a in a state in which there is no deposition on the surface (i.e., the deposition time is 0 seconds), and the measuring device 10 generates the plasma of $O_2$ gas and measures the voltage $V_2$ between the copper disk 12 and the copper plate 13. Then, based on the formula (13), the self bias voltage $V_{dc}$ representing the residual attraction state of the surface of the electrostatic chuck 2a at the initial state is calculated from the voltage $V_2$ which is the measurement result. The data at this time is $V_{dc}$ (=−70V) at the deposition time 0 (s) in FIG. 9, and the data is stored in the storage, such as the RAM 215 of the controller 200.

Next, in the process of FIG. 10(b), after unloading the wafer W, the plasma of the CF type gas is generated by applying the high frequency power for a predetermined time (30 seconds in the embodiment) while supplying the CF type gas, which is an example of a deposition gas, and a deposit R, which is a CF type polymer, is deposited on the surface of the electrostatic chuck 2a.

Subsequently, in the process of FIG. 10(c), the wafer W is placed on the electrostatic chuck 2a, the plasma of the $O_2$ gas is generated, and the voltage $V_2$ between the copper disk 12 and the copper plate 13 is measured. Then, based on the formula (13), the self bias voltage $V_{dc}$ representing the residual attraction state of the surface of the electrostatic chuck 2a at this time point is calculated from the voltage $V_2$, which is the measurement result. The data at this time is $V_{dc}$ (=−68V) when the deposition time is 30 seconds in FIG. 9, and the data is stored in the storage unit, such as the RAM 215 of the controller 200.

Subsequently, in the process of FIG. 10(d), after unloading the wafer W, the plasma of the CF type gas is generated by applying the high frequency power for a predetermined time (30 seconds in the embodiment) while supplying the CF type gas, and the deposition R of the CF type polymer is further deposited on the surface of the electrostatic chuck 2a.

Subsequently, in the process of FIG. 10(e), the wafer W is placed on the electrostatic chuck 2a, the plasma of the $O_2$ gas is generated, and the voltage $V_2$ between the copper disk 12 and the copper plate 13 is measured. Then, based on the formula (13), the self bias voltage $V_{dc}$ (=−66V) representing the residual attraction state of the surface of the electrostatic chuck 2a at this time point is calculated from the voltage $V_2$, which is the measurement result. The data at this time is $V_{dc}$ when the deposition time is 60 seconds (=30+30) in FIG. 9, and the data is stored in the storage unit, such as the RAM 215 of the controller 200.

In the process of FIGS. 10(f) and (g), and in the process of FIGS. 10(h) and (i), the process similar to the process of FIG. 10(c) and FIG. 10(d) is repeated twice. Namely, in the measurement of FIG. 10(g), $V_{dc}$ (=−64V) when the deposition time is 90 seconds in FIG. 9 is calculated, and, in the measurement of FIG. 10(h), $V_{dc}$ (=−62V) when the deposition time is 120 seconds in FIG. 9 is calculated, and the data is stored in the storage unit, such as the RAM 215 of the controller 200.

By performing such measurement in advance, the correlation information representing the correlation between the deposition time and the self bias voltage $V_{dc}$ is accumulated in the storage unit. The example of the correlation information is shown in FIG. 9. Note that the correlation information representing the correlation between the deposition time and the self bias voltage $V_{dc}$ in FIG. 9 is an example of the correlation information representing the correlation between the value corresponding to the electric charge amount measured in advance and the value representing the residual attraction state of the electrostatic chuck 2a.

The correlation information of FIG. 9 accumulated in this manner is referred to in the measurement method according to the embodiment, which is illustrated in FIG. 11. The measurement method illustrated in FIG. 11 is executed by the controller 200 prior to loading the wafer W, and the measurement method includes a determination process of determining as to whether maintenance, such as a cleaning process, is to be performed. As a result, in the measurement method according to the embodiment, maintenance, such as a cleaning process, is performed prior to loading the wafer W in a predetermined case. Accordingly, the shift and cracking of the wafer W caused by the residual attraction on the surface of the electrostatic chuck 2a can be prevented.

Upon detecting that the process of FIG. 11 is started, the controller 200 switches the switch 6a of the relay box 6 to connect the attraction electrode 21 to the measuring device 10. The measuring device 10 measures the voltage $V_2$ (step S10). The measured voltage $V_2$ is transmitted to the controller 200, and, thereby, the controller 200 calculates the self bias voltage $V_{dc}$ based on the voltage $V_2$ (step S12).

Subsequently, the controller 200 determines whether the absolute value of the calculated self bias voltage $V_{dc}$ exceeds a predetermined threshold value $Th_1$ (step S14). Upon determining that the absolute value of the calculated $V_{dc}$ does not exceed the predetermined threshold value $Th_1$, the controller 200 determines that the residual attraction state of the electrostatic chuck 2a is not so large as to cause cracking of the wafer W at the time of charge removal and unloading of the wafer W, and the controller 200 terminates the process.

However, upon determining, at step S14, that the absolute value of the calculated self bias voltage $V_{dc}$ exceeds the predetermined threshold value $Th_1$, the controller 200 determines whether the absolute value of the self bias voltage $V_{dc}$ exceeds a predetermined threshold value $Th_2$ (step S16).

For example, as illustrated in FIG. 11, the relation between the threshold value $Th_1$ and the threshold value $Th_2$ is such that the absolute value of the threshold value $Th_1$ is less than the absolute value of the threshold value $Th_2$. For example, the threshold value $Th_1$ is an example of an index such that, when the absolute value of the self bias voltage $V_{dc}$ is greater than the threshold value $Th_1$, the pin torque of the pusher pins become large, and the residual attraction state is in a state in which cracking may occur in the wafer W during charge removal.

For example, the threshold value $Th_2$ is an example of an index such that, when the absolute value of the self bias voltage $V_{dc}$ is greater than the threshold value $Th_2$, the residual attraction state is a state in which there is a high possibility that cracking occurs in the wafer W during charge removal, and it is necessary to perform maintenance by opening the processing container.

Accordingly, upon determining, at step S16, that the absolute value of the self bias voltage $V_{dc}$ is greater than the predetermined threshold value $Th_2$, the controller 200 controls to open the processing container C to perform maintenance, such as alcohol wiping of the surface of the electrostatic chuck 2a, and the controller 200 terminates the process.

In contrast, upon determining, at step S16, that the absolute value of the self bias voltage $V_{dc}$ does not exceed the predetermined threshold value $Th_2$, the controller 200 sets the cleaning process time to be longer than usual so that waferless dry cleaning is performed, and the controller 200 terminates the process. As an example of setting the cleaning process time to be longer than usual, for example, a case can be considered in which the cleaning process time is set to be 80 seconds while the usual cleaning process time is 20 seconds.

As described above, a determination process is executed in which the storage unit storing the correlation information between the self bias voltage $V_{dc}$ and the deposition time is referred to, and the residual attraction state of the surface of the electrostatic chuck 2a is determined based on the self bias voltage $V_{dc}$ calculated from the measured voltage $V_2$. After referring to the storage unit, upon determining, in the determination process, that the absolute value of the self bias voltage $V_{dc}$ calculated from the measured voltage $V_2$ exceeds at least one of the predetermined threshold value $Th_1$ and the predetermined threshold value $Th_2$, the controller 200 determines to perform a cleaning process of the electrostatic chuck 2a or a cleaning process of cleaning inside the processing container C, or any other maintenance. Note that, in the determination process, the residual attraction state of the surface of the electrostatic chuck 2a may be determined based on the measured voltage $V_2$.

As a result, a guideline for optimizing the operation method and for improving the operation can be obtained, such as the frequency of cleaning performed depending on the self bias voltage $V_{dc}$, the cleaning processing time, and the timing for executing any other maintenance.

The measuring device, the measurement method, and the plasma processing device are described above by the embodiment. However, the measuring device, the measurement method, and the plasma processing device according to the present invention are not limited to the above-described embodiment, and various modifications and improvements may be made within the scope of the present invention. The items described in the embodiment may be combined, provided that they do not contradict.

The substrate processing device according to the present invention can be applied to any one type of capacitively coupled plasma (CCP), inductively coupled plasma (ICP), a radial line slot antenna, electron cyclotron resonance plasma (ECR), and helicon wave plasma (HWP).

In the embodiment, the wafer W is described as the example of the substrate. However, the substrate is not limited to the wafer W. For example, the substrate may be various types of substrates used for a liquid crystal display (LCD) or a flat panel display (FPD), a photo mask, a CD substrate, a printed circuit board, and so forth.

What is claimed is:

1. A measuring device comprising:
   a switch that switches a connection of an electrode to which a direct current voltage is applied, wherein the electrode is within an electrostatic chuck disposed in a plasma processing device;
   a component provided with electrostatic capacitance, wherein the component is connected to the switch; and
   a measuring unit that measures a value corresponding to an electric charge amount accumulated in the component provided with the electrostatic capacitance,
   wherein, during execution of substrate processing by plasma, the switch switches the connection of the electrode to the component provided with the electrostatic capacitance, and
   wherein, during the execution of the substrate processing, the measuring unit measures the value corresponding to the electric charge amount accumulated in the component provided with the electrostatic capacitance.

2. The measuring device according to claim 1, wherein the switch is for switching the connection of the electrode between a direct-current power supply and the component provided with the electrostatic capacitance.

3. The measuring device according to claim 1, further comprising:
   a filter that removes the high frequency electric power, wherein the filter is disposed between the switch and the component provided with the electrostatic capacitance.

4. The measuring device according to claim 1, wherein, during execution of a cleaning process, the switch switches the connection of the electrode to the component provided with the electrostatic capacitance, and
   wherein, during the execution of the cleaning process, the measuring unit measures the value corresponding to the electric charge amount accumulated in the component provided with the electrostatic capacitance.

5. The measuring device according to claim 1, wherein, after the switch switches the connection of the electrode to the component provided with the electrostatic capacitance, a high frequency power source applies the high frequency electric power.

6. The measuring device according to claim 1, wherein the measuring device measures a self bias voltage of plasma based on the measured value corresponding to the electric charge amount.

7. The measuring device according to claim 1, wherein the measuring unit is provided with a probe installed on a surface of the component provided with the electrostatic capacitance, wherein the probe contacts the surface or probe does not contact the surface, and wherein the component provided with the electrostatic capacitance and the probe are installed inside a vacuum container.

* * * * *